US010177774B2

(12) United States Patent
Palaskas et al.

(10) Patent No.: US 10,177,774 B2
(45) Date of Patent: Jan. 8, 2019

(54) DIGITAL TIME CONVERTER SYSTEMS AND METHODS

(71) Applicant: INTEL IP CORPORATION, Santa Clara, CA (US)

(72) Inventors: Georgios Yorgos Palaskas, Portland, OR (US); Paolo Madoglio, Beaverton, OR (US); Peter Preyler, Weyer (AT); Rotem Banin, Pardes-hana (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/583,063

(22) Filed: May 1, 2017

(65) Prior Publication Data

US 2018/0006658 A1   Jan. 4, 2018

Related U.S. Application Data

(63) Continuation of application No. 15/199,217, filed on Jun. 30, 2016, now Pat. No. 9,641,185.

(51) Int. Cl.
*H03M 1/66* (2006.01)
*H03M 1/06* (2006.01)
(Continued)

(52) U.S. Cl.
CPC .............. *H03M 1/06* (2013.01); *H03F 3/195* (2013.01); *H03F 3/24* (2013.01); *H03M 1/466* (2013.01);
(Continued)

(58) Field of Classification Search
CPC ........ H03M 1/46; H03M 1/50; H03M 1/1009; H03M 1/1023; H03M 1/1215; H03M 1/66;
(Continued)

(56) References Cited

U.S. PATENT DOCUMENTS 6,628,276 B1 *   9/2003   Elliott .................... G09G 5/008
                                                  345/213
8,222,966 B2 *   7/2012   Ravi ........................ H03C 3/10
                                                  332/144

(Continued)

OTHER PUBLICATIONS

Notice of Allowance dated Jan. 12, 2017 for U.S. Appl. No. 15/199,217.

(Continued)

*Primary Examiner* — Linh Nguyen
(74) *Attorney, Agent, or Firm* — Eschweiler & Potashnik, LLC

(57) ABSTRACT

A digital to time converter (DTC). The DTC includes a lookup table, a divider, a thermometric array and a switched capacitor array. The lookup table is configured to generate one or more corrections based on thermometric bits of an input signal. The divider is configured to generate a plurality of divider signals from an oscillator signal based on the one or more corrections. The thermometric array is configured to generate a medium approximation signal from the plurality of divider signals based on the one or more corrections. The switched capacitor array is configured to generate a digital delay signal from the medium approximation signal based on the one or more corrections and switched capacitor bits of the input signal.

21 Claims, 6 Drawing Sheets

(51) Int. Cl.
*H03M 1/46* (2006.01)
*H03M 7/42* (2006.01)
*H03F 3/195* (2006.01)
*H03F 3/24* (2006.01)
*H03M 1/68* (2006.01)
*H03M 1/82* (2006.01)
*H03M 5/02* (2006.01)

(52) U.S. Cl.
CPC ............... *H03M 1/68* (2013.01); *H03M 1/82* (2013.01); *H03M 5/02* (2013.01); *H03M 7/42* (2013.01)

(58) Field of Classification Search
CPC ...... H03M 1/002; H03M 1/201; H03M 3/394; H03L 2207/50; H03L 7/0802; H03L 7/0893; H03L 7/093; H03L 7/097; H03L 7/10; H03L 7/18; H03L 7/1976
USPC ......... 341/118–120, 145, 150, 172; 327/156, 327/159, 141, 153; 331/1 A, 57, 34, 16
See application file for complete search history.

(56) References Cited

U.S. PATENT DOCUMENTS

| | | | | |
|---|---|---|---|---|
| 9,071,304 | B2* | 6/2015 | Banin | H03M 1/66 |
| 9,209,958 | B1* | 12/2015 | Palaskas | H04B 17/21 |
| 2009/0190694 | A1* | 7/2009 | Kobayashi | H03C 3/0941 |
| | | | | 375/302 |
| 2009/0322574 | A1* | 12/2009 | Rivoir | G04F 10/005 |
| | | | | 341/120 |
| 2011/0156783 | A1* | 6/2011 | Pavlovic | H03L 7/081 |
| | | | | 327/159 |
| 2011/0304361 | A1* | 12/2011 | Henzler | G04F 10/005 |
| | | | | 327/105 |
| 2012/0268184 | A1* | 10/2012 | Baumann | H03K 5/135 |
| | | | | 327/277 |
| 2013/0169457 | A1 | 7/2013 | Hello et al. | |
| 2014/0002288 | A1* | 1/2014 | Scholz | H03M 1/66 |
| | | | | 341/144 |
| 2014/0266837 | A1 | 9/2014 | Henzler et al. | |
| 2015/0036767 | A1* | 2/2015 | Degani | H04L 27/36 |
| | | | | 375/298 |
| 2016/0056827 | A1 | 2/2016 | Vlachoglannakis et al. | |
| 2016/0182072 | A1 | 6/2016 | Preyler et al. | |
| 2016/0285496 | A1* | 9/2016 | Larsson | G06F 1/1626 |
| 2016/0337055 | A1* | 11/2016 | Ravi | H03M 1/84 |

OTHER PUBLICATIONS

Extended European Search Report dated Dec. 5, 2017 for Application No, 17174855.1-1805.

Lee, Hae-Chang. "An Estimation Approach to Clock and Data Recovery." Nov. 2006. 122 pages.

Cheng, Kuo-Hsing et al. "A 0.77 ps RMS Jitter 6-GHz Spred-Spectrum Clock Generator Using a Compensated Phase-Rotating Technique." IEEE Journal of Solid-State Circuits, vol. 46, No. 5, May 2011. 16 pages.

Casper, Bryan et al. "Clocking Analysis, Implementation and Measurement Techniques for High-Speed Data Links—A Tutorial." IEEE Transactions on Circuits and Systems-1: Regular Papers, vol. 56, No. 1, Jan. 2009, 23 pages.

* cited by examiner

DIGITAL TIME CONVERTER SYSTEMS AND METHODS

REFERENCE TO RELATED APPLICATION

This application is a continuation of U.S. application Ser. No. 15/199,217 filed on Jun. 30, 2016, the contents of which are incorporated by reference in their entirety.

BACKGROUND

Digital to time converters (DTCs) are typically used in radio frequency (RF) transceivers and similar systems. The DTC is used, for example, to generate a time delay of a reference signal based on a digital input.

There are three characteristics of DTCs that are of significance: quantization resolution, frequency range, and power consumption. The quantization resolution determines the smallest difference of two delays the DTC is capable of generating. Frequency range is the difference between frequencies of which the DTC is capable of producing. Power consumption is the amount of power consumed by the DTC during operation.

These characteristics tend to be at odds with each other. For example, obtaining a finer quantization resolution typically increases the power consumption.

What is needed is a technique to obtain relatively fine quantization resolution for suitable frequency ranges and power consumption.

DETAILED DESCRIPTION

Figure 1:
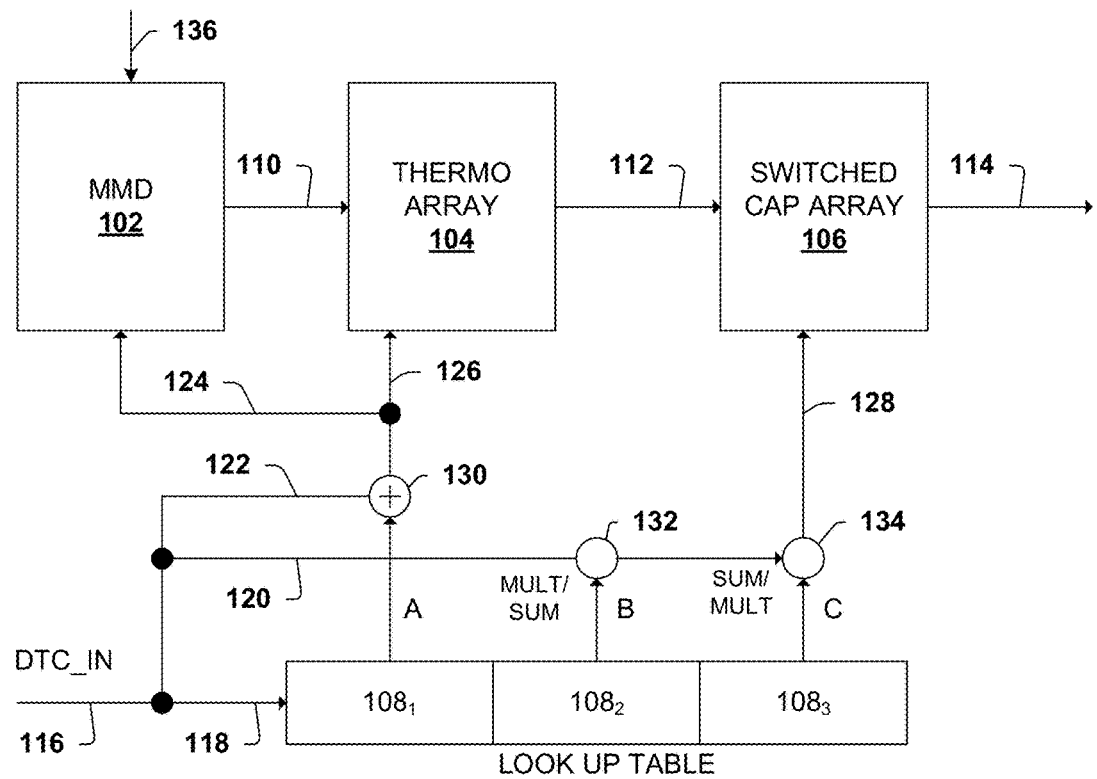
FIG. 1 is a diagram illustrating a digital to time converter (DTC) system 100 utilizing switched capacitors.

The systems and methods of this disclosure are described with reference to the attached drawing figures, wherein like reference numerals are used to refer to like elements throughout, and wherein the illustrated structures and devices are not necessarily drawn to scale.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC, an electronic circuit and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

A digital to time converter (DTC) converts a digital input, code or signal into an analog time based delay. The delay is applied to a signal whose edges/transitions (0-Vcc or Vcc-0) depend on the digital input. The DTC is also referred to as digital delay generator. Generally, the DTC provides precise delays for triggering, syncing, delaying and gating events. Additionally, the DTC can be used to generate phase modulated signals for polar transmitters, for local oscillator (LO) signal generation in a receiver, inside a phase locked loop (PLL) and the like.

There are several characteristics of DTCs that are of significance; quantization resolution, frequency range, delay range and power consumption. The quantization resolution determines how small of timing differences or variations a DTC is capable of generating. Power consumption is the amount of power consumed by the DTC during operation. The delay range is a maximum delay that the DTC is capable of generating.

Some DTCs are implemented in a segmented fashion, using a multi modulus divider (MMD), a thermometric edge interpolator array and a binary section or unit. The MMD provides coarse steps. The thermometric array is used to obtain smaller steps and the binary section obtains a final selected resolution.

The binary section is sometimes inverter based and typically has large, non-linear step variation and can even be non-monotonic. To overcome this, one approach utilizes a larger thermometric array to cover more bits and a smaller binary section. However, using more thermometric bits to maintain the same resolution increases power consumption and can generate dynamic errors in the DTC. Another approach uses a larger binary section, but adjusts device length and width for inverters and the like used in the inverter based binary section to attempt to mitigate variations in the binary section. However, adjusting device length and width may not be feasible, such as with small 14 nano-meter devices.

Another issue with the inverter based binary section is that predistortion needs to account for the non-linear variations of the binary section. The predistortion attempts to mitigate distortions in generated delays or signals. The binary variations require a relatively large lookup table for predistortion in order to account for the binary variations.

Various embodiments are disclosed for DTCs that incorporate an array of relatively small capacitors that can be switched ON and OFF to obtain selected delays with a suitable quantization resolution. Unlike inverter based binary sections, the small capacitor array has minimal variations between cells. Further, the array of small capacitors allows use of a relatively smaller thermometric array, which mitigates consumption of power.

In one example, a DTC utilizing the array of small capacitors is used in a phase generation portion of a polar modulator based transmitter. The DTC is used to modulate a local oscillator (LO) signal with phase information. A power amplifier modulates an amplitude on the phase modulated LO signal. Additionally, the DTC utilizing the array of small capacitors can be used to generate phase modulated signals for polar transmitters, for local oscillator (LO) signal generation in a receiver, inside a phase locked loop (PLL) and the like.

FIG. 1 is a diagram illustrating a digital to time converter (DTC) system 100 utilizing switched capacitors. The DTC, also referred to as a digital time delay, system 100 mitigates power consumption while providing a relatively fine quantization resolution. The system 100 can also be configured as an apparatus.

The system 100 is provided in a somewhat simplified format in order to facilitate understanding. It is appreciated that suitable variations are contemplated.

The DTC system 100 receives an input signal 116 and generates a digital delay or digital time delay 114 based on the input signal or code 116. The delay is applied to edges/transitions 0 to Vcc (supply voltage) and Vcc to 0 according to the input signal 116. The DTC system 100 utilizes an oscillator signal 136. The input signal 116 is digital whereas the delay 114 is analog and is based on the input signal 116. The input signal 116 includes, for example, an overall DTC input signal that includes an MMD signal, a DCEI signal and a switched capacitor signal. The DTC system 100 can operate with frequencies in the giga Hz (GHz) range including, for example, frequencies up to 6 GHz.

The system 100 includes a multi-modulus divider (MMD) 102, a thermometric array 104 and a switched capacitor array 106. Additionally, the system 100 utilizes a lookup table 108.

The LUT 108 is referenced or accessed by a portion of the bits of the input signal. The portion used is referred to as the thermometric bits 118. The LUT 108 is configured to provide corrections that include a thermometric correction A, a inverse binary delay correction B and a residue correction C. The inverse binary delay correction B can also be referred to as a fine delay correction. The one or more corrections can also be referred to and/or used as coefficients, factors, parameters and the like. The one or more corrections are used to adjust input signals to the MMD 102, array 104, and the switched capacitor array 106 based PVT variations and the like.

The LUT 108 includes a first table $108_1$ configured to provide the thermometric correction A in response to the thermometric bits 118. The LUT 108 also includes a second table $108_2$ configured to provide the inverse binary delay correction B in response to the thermometric bits 118. The correction B is proportional to the inverse of the binary delay step. Additionally, the LUT 108 includes a third table $108_3$ configured to provide the residue correction C in response to the thermometric bits 118. In one example, the first table $108_1$ is configured as a 256×4 bit array, the second table $108_2$ is configured as a 256×4 bit array and the third table $108_3$ is configured as a 256×7 bit array.

The MMD 102 generates a coarse approximation of a digital delay 110 based on an MMD input 124 and the oscillator signal 136. The MMD 102 divides the oscillator signal 136 based on the MMD input 124. The MMD input 124 is derived higher order bits 122 of the input signal 116 and the thermometric correction A from the first table $108_1$ of the lookup table 108.

In one example, the MMD includes a decoder configured to receive the MMD input 124. The decoder is configured to decode the MMD input 124.

The MMD 102 is shown as generating the coarse approximation, however it is appreciated that other suitable circuits and/or components can be utilized to generate the coarse approximation 110. The MMD 102 is an example of a suitable coarse delay component configured to generate the coarse approximation 110. For example, a multiplexer and/or phase multiplexor can be used to generate the coarse approximation 110 instead of the MMD 102.

A first summation component 130 combines the thermometric correction A from the first lookup table $108_1$ with the higher order bits 122 to generate the MMD input 124. The summation component 130 also provides thermometric input 126. In one example, a terminal or node is coupled to an output of the summation component 130 and is further configured to provide the MMD input 124 and the thermometric input 126.

The thermometric array 104 is configured to receive the coarse approximation 110 from the MMD 102 and generate a medium approximation 112 based on the thermometric input signal 126. The coarse approximation 110 includes a plurality of signals from the MMD 102. The medium approximation 112 has a finer quantization resolution than the coarse approximation 110. In one example, the medium approximation 112 has a 488 femtoseconds (fs) quantization resolution.

The thermometric array 104 in one example, includes an array of inverters. The thermometric array 104, also referred to as the DCEI thermometric array, can include other components and circuitry with similar and suitable functionality. The driving strength of the array 104 depends on how many of the inverters are active.

In one example or embodiment, shown in FIG. 3 and explained in further detail below, the thermometric array 104 includes 2^Nth inverters, where each one of the can connect to either MMD1 or MMD2 of the coarse approximation 110. An interpolated delay is generated between MMD1 and MMD2 depending on how many thermometric inverters are connected to each of MMD1 and MMD2. For example, if all the inverters in the array 104 are connected to MMD1, then the array output follows MMD1, if half are connected to MMD and the other half to MMD2, an edge is obtained approximately half-way between MMD1 and MMD2. Further, if all the inverters in the array 104 are connected to MMD2, then the array output follows MMD2. The number of inverters connected to each is dependent upon the thermometric input signal 126.

The thermometric array 104 uses incrementally more power per additional bit of quantization than the switched capacitor array 106 and/or other types of arrays. Thus, the number of bits or size of the thermometric array 104 is relatively low. In one example, the array 104 has a size of 7 bits and the DTC system 100 relies on the switched capacitor array for providing 4 additional bits of resolution. This example utilizes substantially less power than an all thermometric array to provide all 11 bits of resolution.

The output of the thermometric array 104, the medium approximation 112 can be modified using a suitable technique. In one example, a capacitor coupled to ground is configured to integrate the current of the thermometric inverters to generate delayed edges.

A second component 132 is configured to multiply/combine or add the signal 120 with the inverse binary delay correction B. An output of the component 132 is added or multiplied with the residue correction C to generate a select signal 128 at a third component 134. The select signal 128 is also referred to as a switched capacitor signal or a fine delay control/signal.

The select signal 128 is obtained using the inverse binary delay correction B, the residue correction C and the signal 120. In one example, the second component 132 multiplies the binary delay correction B with the signal 120 and then the third component 134 adds the residue correction C to obtain the select signal 128. In another example, the second component 132 adds the inverse binary delay correction B with the signal 120, then the third component 134 multiplies the sum with the residue correction C to obtain the select signal 128. Thus, in the first example, the second component 132 is configured to multiply its inputs and provide the result as its output and the third component 134 is configured to add/sum its inputs and provide the sum as its output. In the second example, the second component 132 is configured to sum its inputs and provide the sum at its output and the third component 134 is configured to multiply its inputs and provide the result at its output.

The switched capacitor array 106 is configured to generate the digital delay 114 from the medium approximation signal 112 based on the switched capacitor select signal 128.

The digital delay 114 includes edge/transition delays including 0 to Vcc (supply voltage) and Vcc to 0. The variation between steps of the array 106 is relatively linear due to the use of switched capacitors. The digital delay 114 has a relatively fine quantization, such as, for example, 30.5 fs.

The switched capacitor array 106 includes capacitors based on metal oxide semiconductor (MOS) devices, inter-digitated metals, metal insulator metal (MIM) and the like. The capacitors are relatively small in size in order to obtain the fine resolution for the array 106. In one example, the capacitors are sized to about 0.2 femto Farads (fF).

The switched capacitor array 106 includes a capacitor decoder configured to decode the switched capacitor select signal 128. In one example, the capacitor decoder for the array 106 is a 6 bit decoder covering bits <5:0>. The capacitor decoder is configured to select and/or activate which capacitors are connected to a path or line through the array 106.

In one example, the input signal 116 has 15 bits denoted as <14:0>. The thermometric bits 118 include bits <11:4> and are used to reference or look up entries in the LUT 108. The MMD input 124 includes higher bits <14:11>. The thermometric array 104 input 126 is also the thermometric bits <10:4>. The input 122 to the first summation component 130 includes bits <14:4>. The input 120 to the second summation/multiplier component 132 includes bits <3:0>. The input to the third summation component 134 includes bits <7:0>. The input signal 128 for the switched capacitor array can include extra bits for PVT coverage, such as bits <5:0>, which would require bits <5:0> at the output to the third summation component 134.

Thus, the DTC system 100 mitigates power consumption while providing a relatively fine quantization resolution. The switched capacitor array provides the fine quantization resolution, is relatively linear compared to inverter based binary arrays, and mitigates power consumption. The corrections A, B and C are generated using only a portion of the input signal 116, the thermometric signal 118. Thus, the size if the LUT 108 can be relatively small compared to other digital delay systems and arrangements.

It is appreciated that suitable variations of the system 100 are contemplated. For example, various sizes of the arrays 104 and 106 and the MMD 102 can be utilized.

Figure 2:
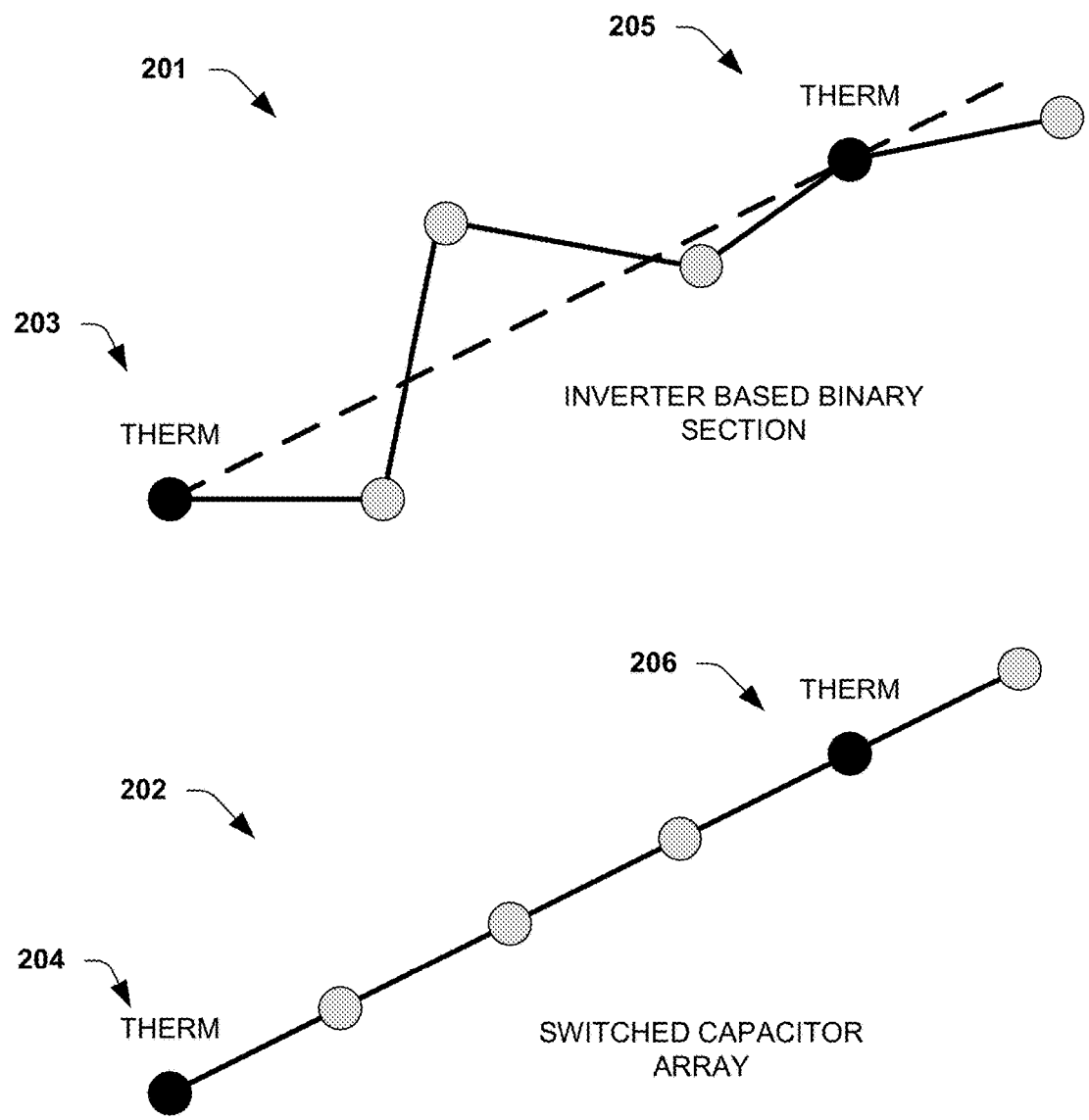
FIG. 2 is a diagram illustrating quantization steps for a binary inverter array and a switched capacitor array.

FIG. 2 is a diagram illustrating quantization steps for a binary inverter array and a switched capacitor array. The diagram is provided for illustrative purposes only.

A first portion 201 shows a digital delay output signal from a binary inverter. The digital delay output signal is shown with a first thermometric step 203 and a second thermometric step 205. There are three binary steps shown therebetween. In one example, the binary steps are at ¼ (0.25×), ½ (0.5×), and ¾ (0.75×) proceeding from the first step 203 to the second thermometric step 205. It can be seen that there is substantial variation or non-linearity between the binary steps. This non-linearity generally requires correction. The binary non-linearity correction can require a much larger lookup table that than used for the LUT 108.

A second portion 202 is shown for a digital delay output signal using a switched capacitor array, such as the array 106, instead of a binary inverter array. The digital delay output signal is shown with a first thermometric step 204 and a second thermometric step 206. There are three switched capacitor steps shown therebetween. In one example, the switched capacitor steps are at ¼ (0.25×), ½ (0.5×), and ¾ (0.75×) proceeding from the first step 204 to the second thermometric step 206. It can be seen that there is substantial linearity between the steps. This linearity generally does not require correction and permits a smaller sized lookup table, such as the LUT 108, when compared with inverter based binary sections.

Figure 3:
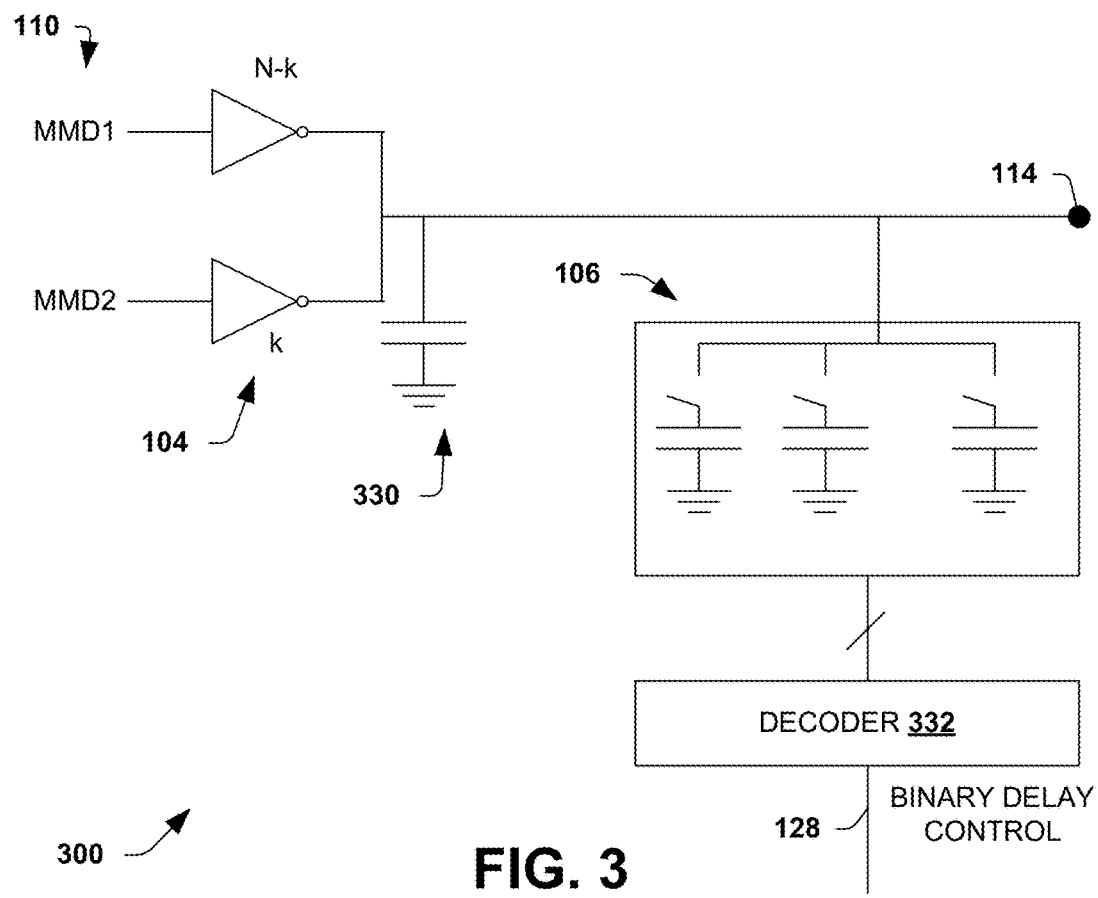
FIG. 3 is a diagram illustrating a portion 300 of a digital time converter (DTC) for generation of a digital delay using a switched capacitor array.

FIG. 3 is a diagram illustrating a portion 300 of a digital time converter (DTC) for generation of a digital delay using a switched capacitor array. The portion 300 can be utilized with the system 100 and is provided in greater detail to facilitate understanding. It is appreciated that suitable variations are contemplated.

The portion 300 includes a thermometric array 104 that receives a plurality of signals 110 in parallel from a multi-modulous divider (MMD), such as the MMD 102 shown above. The plurality of signals comprise the coarse output signal 110 described in FIG. 1 and above.

The thermometric array 104 includes an array of thermometric inverters. The thermometric array 104, also referred to as the DCEI thermometric array, can include other components and circuitry with similar and suitable functionality. The driving strength of the array 104 depends on how many of the inverters are active. In one example or embodiment, the thermometric array 104 includes 2^Nth inverters, where each one of the can connect to either MMD1 or MMD2 of the coarse approximation 110. An interpolated delay is generated between MMD1 and MMD2 depending on how many thermometric inverters are connected to each of MMD1 and MMD2. For example, if all the inverters in the array 104 are connected to MMD1, then the array output follows MMD1, if half are connected to MMD and the other half to MMD2, an edge is obtained approximately half-way between MMD1 and MMD2. Further, if all the inverters in the array 104 are connected to MMD2, then the array output follows MMD2. The number of inverters connected to each is dependent upon the thermometric input signal 126. Outputs of the thermometric inverters are connected together to provide the medium approximation.

The output of the thermometric array 104, the medium approximation 112 can be modified using a suitable technique. In one example, a capacitor 330 coupled to ground is configured to integrate the current of the thermometric inverters to generate delayed edges.

The portion 300 also includes a switched capacitor array 106. The array 106 includes relatively small capacitors. The small capacitors are configured to have a unit capacitor size small enough to achieve a selected resolution, such as 30 fs.

The switched capacitor array 106 can be connected directly to the thermometric array 104 output, as shown in FIG. 3. In other examples, a buffer and/or other component can buffer or store the output of the thermometric array 104.

The small capacitors of the array 106 are individually selectable to be activated/connected to its output or deactivated/disconnected from its output. In one example, each capacitor or unit of the array 106 include a switch that can be activated, connected to the array 106 output or deactivated, disconnected from the array 106 output. The switch for each capacitor or unit is configured to receive a control signal configured to select/activate the capacitor or de-select/de-activate the capacitor.

The switch capacitor input signal 128, also referred to as a fine delay control/signal, is decoded and used to selectively activate a portion of the capacitors. The total additional delay when all capacitors are on/activated is determined by or as a thermometric step of the DTC. Extra capacitors/cells can be used to provide proper coverage over process, voltage and temperature variations (PVT).

A switched capacitor decoder 332 is configured to receive the fine delay signal 128 and generate one or more capacitor control signals to activate/connect individual capacitors of the array 106 to the output of the array 106.

The switched capacitor array 106 can permit implementation in 14 nano-meters (nm) devices, where no length tweaking is possible. The array 106 also reduces the number of thermometric bits needed, which reduces power consumption and errors, such as dynamic errors.

The improved linearity of the switched capacitor array 106 simplifies non-linearity correction. Thus, the size of a lookup table for corrections can be ¹⁄₁₆ of the size of a similar DTC that uses binary inverters to obtain the same resolution.

Figure 4:
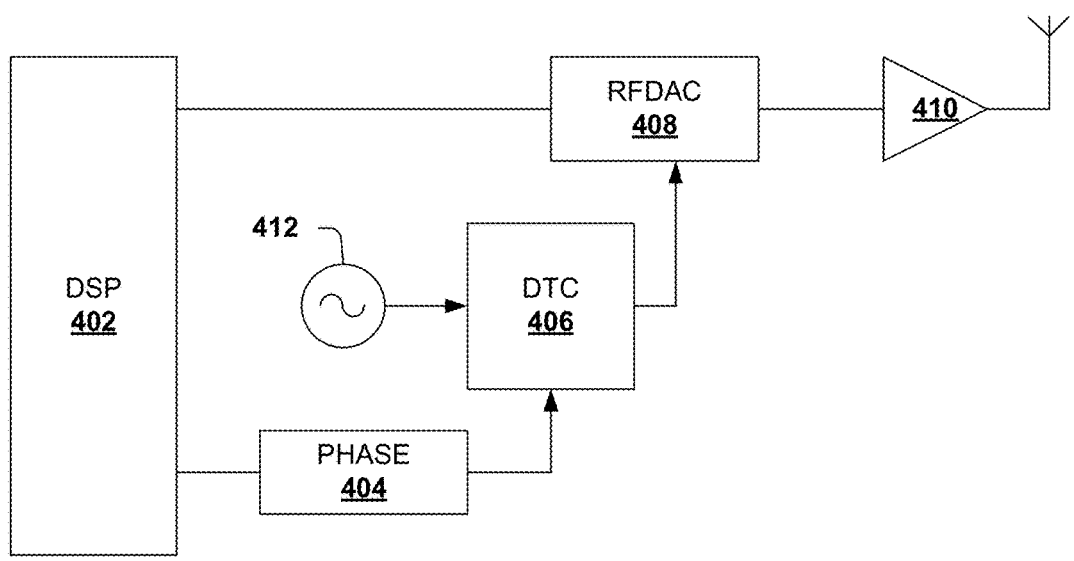
FIG. 4 is a diagram of a transmitter 400 using a DTC having a switched capacitor array.

FIG. 4 is a diagram of a transmitter 400 using a DTC having a switched capacitor array. The transmitter 400 is provided for illustrative purposes and it is appreciated that variations are permitted.

The transmitter 400 includes a digital signal processing (DSP) component 402, a phase component 404, a DTC 406, a phase locked loop (PLL) 412, an RF digital to analog converter (DAC) 408, and a power amplifier 410.

The DSP 402 converts data or a signal into a phase signal and an amplitude signal. The phase component 404 transitions the phase signal and provides the phase signal to the DTC 406.

The DTC 406 receives a PLL signal on one of its inputs and a phase signal (code word) on another. The PLL 412 generates the PLL signal. The DTC 406 generates an output, which is provided to the RFDAC 408. The generated output has a selected fine quantization resolution. In one example, the resolution is about 30.5 fs, however other suitable resolutions can be selected.

The DTC 406 includes a switched capacitor array, such as the switched capacitor array 106 described above and in FIG. 1 and FIG. 3. The switched capacitor array provides substantially linear capacitor steps, such as shown above with regard to FIG. 2. Further, the switched capacitor array permits the selected fine resolution while mitigating power consumption. The DTC 406 also utilizes a smaller sized lookup table due to the linearity of the switched capacitor array.

The RFDAC converts the amplitude signal using the converter output signal into an RF signal. The RF signal thus includes both amplitude modulated information and phase modulated information. The RF signal is amplified by power amplifier 410 and can be provided for transmission, such as by an antenna.

The DTC 406 provides the converter output with enhanced linearity, finer quantization resolution and lower power consumption than other types of DTCs. As a result, the RF signal is generated with enhanced linearity and resolution.

The DTC 406 is shown within a transmitter 400 for illustrative purposes. It is also contemplated that the DTC 406 can be used in other examples or embodiments with a receiver for generation of a local oscillator (LO) signal.

Figure 5:
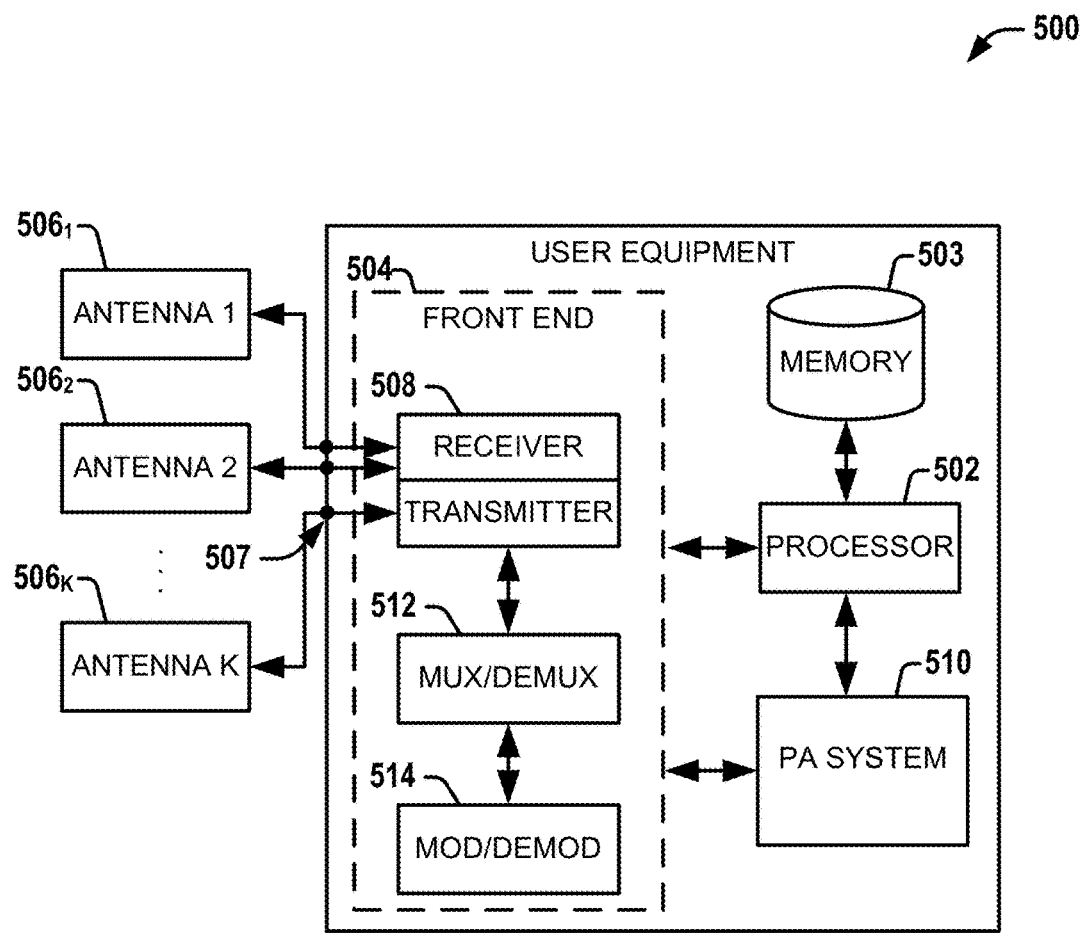
FIG. 5 is a diagram illustrating an exemplary user equipment or mobile communication device 500

FIG. 5 is a diagram illustrating an exemplary user equipment or mobile communication device 500 that can be utilized with one or more aspects of the digital to time converters, transmitters and/or variations thereof, as described above.

The mobile communication device 500, for example, comprises a digital baseband processor 502 that can be coupled to a data store or memory 503, a front end 504 (e.g., an RF front end, an acoustic front end, or the other like front end) and a plurality of antenna ports 507 for connecting to a plurality of antennas $506_1$ to $506_k$ (k being a positive integer). The antennas $506_1$ to $506_k$ can receive and transmit signals to and from one or more wireless devices such as access points, access terminals, wireless ports, routers and so forth, which can operate within a radio access network or other communication network generated via a network device. The user equipment 500 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 504 can include a communication platform, which comprises electronic components and associated circuitry that provide for processing, manipulation or shaping of the received or transmitted signals via one or more receivers or transmitters 508, a mux/demux component 512, and a mod/demod component 514. The one or more transmitters 508 are configure to use a DTC having a switched capacitor array, such as the DTC system 100 described above, which facilitates generation of the transmitted signals.

The front end 504, for example, is coupled to the digital baseband processor 502 and the set of antenna ports 507, in which the set of antennas $506_1$ to $506_k$ can be part of the front end.

The user equipment device 500 can also include a processor 502 or a controller that can operate to provide or control one or more components of the mobile device 500. For example, the processor 502 can confer functionality, at least in part, to substantially any electronic component within the mobile communication device 500, in accordance with aspects of the disclosure.

The processor 502 can operate to enable the mobile communication device 500 to process data (e.g., symbols, bits, or chips) for multiplexing/demultiplexing with the mux/demux component 512, or modulation/demodulation via the mod/demod component 514, such as implementing direct and inverse fast Fourier transforms, selection of modulation rates, selection of data packet formats, inter-packet times, etc. Memory 503 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 502 is functionally and/or communicatively coupled (e.g., through a memory bus) to memory 503 in order to store or retrieve information necessary to operate and confer functionality, at least in part, to communication platform or front end 504, the power amplifier (PA) system 510 and substantially any other operational aspects of the PA system 510.

Figure 6:
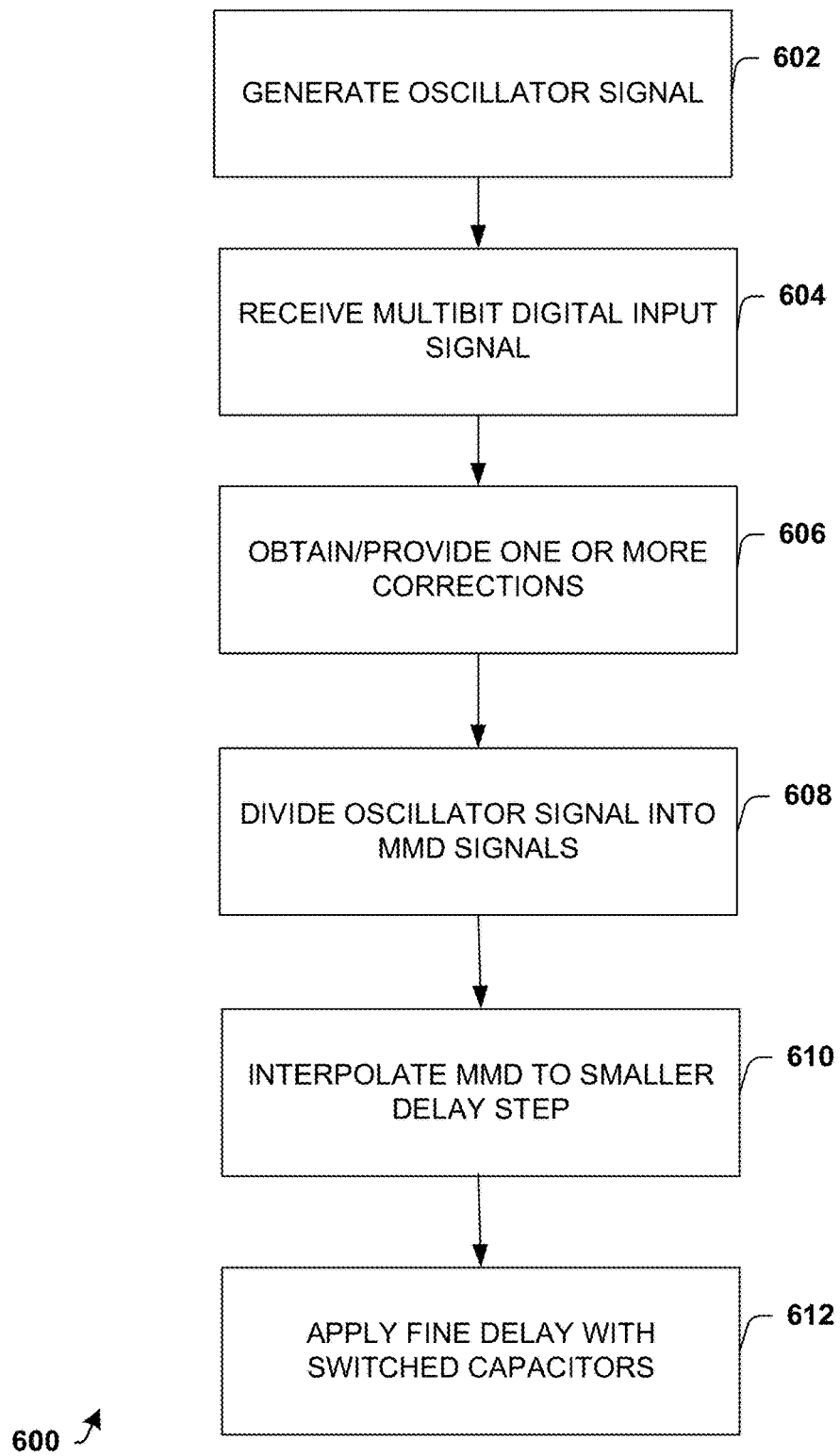
FIG. 6 is a flow diagram illustrating a method 600 of operating a digital to time converter (DTC) using a switched capacitor array.

FIG. 6 is a flow diagram illustrating a method 600 of operating a digital to time converter (DTC) using a switched capacitor array. The method 600 can be used within a transceiver for communication purposes and/or other applications.

The above systems, devices, arrangements and the like can be referenced and used with or in conjunction with the method 600.

A phase locked loop (PLL) generates an oscillator signal is at a selected frequency at block 602. The PLL and/or similar component can be configured to generate the oscillator signal.

A DTC receives a multibit, digital input signal at block 604. The digital input signal indicates a selected delay for the DTC. The input signal has a plurality of bits, such as 15 bits. The bits include a higher order portion that includes thermometric bits and a lower order portion. The lower order portion is also referred to as the switched capacitor bits. In one example, the thermometric bits exclude the 4 lowest bits.

A lookup table of the DTC provides one or more corrections at block 606 based on the thermometric bits. The one or more corrections can include a thermometric correction A, an inverse binary delay correction B and a residue correction C. It is noted that the switched capacitor bits are not used to generate the one or more corrections due to the use of switched capacitors instead of binary inverters.

A divider divides the oscillator signal into a plurality of multi-modulus divider (MMD) signals according to the input signal and the one or more corrections at block 608. The plurality of MMD signals are also referred to as a coarse approximation signal, such as signal 110. In one example, the MMD signals include MMD1 and MMD2, as shown in FIG. 3. In particular, the division is based on an MMD input, which is derived from the input signal and the thermometric correction A. The MMD input can be derived from the input signal by adding higher order bits 122 with the thermometric correction A as shown in FIG. 1 and described above. It is appreciated that other components and/or circuits can be configured to generate the coarse approximation signal.

A thermometric array generates a medium approximation signal from the plurality of MMD signals based on the one or more corrections and the input signal at block 610. In one example, the thermometric array, such as the array 104 described above, includes a plurality of selectable thermometric inverters that receive the plurality of MMD signals in parallel. The outputs of the thermometric inverters are connected to provide the medium approximation signal.

In one example, the thermometric array generates the medium approximation signal based on a thermometric input signal, such as the signal 126 described above.

A switched capacitor array generates a digital delay from the medium approximation signal based on the one or more corrections and the input signal at block 612. In one example, the switched capacitor array generates the digital delay from the medium approximation signal based on a switched capacitor input signal, such as the input signal 128 described above. The switched capacitor array includes relatively small capacitors. The small capacitors are configured to have a unit capacitor size small enough to achieve a selected resolution, such as 30 fs.

The switched capacitor array can be connected directly to the thermometric array output or medium approximation signal, as shown in FIG. 3. In other examples, a buffer and/or other component can buffer or store the medium approximation signal from the thermometric array.

The small capacitors of the array are individually selectable to be activated/connected to its output or deactivated/disconnected from its output. In one example, each capacitor or unit of the array includes a switch that can be activated, connected to an array output or deactivated, disconnected from the array output. The switch for each capacitor or unit is configured to receive a control signal configured to select/activate the capacitor or de-select/de-activate the capacitor.

The switch capacitor input signal, also referred to as a fine delay signal, is decoded and used to selectively activate a portion of the capacitors. The total additional delay when all capacitors are on/activated is determined by or as a thermometric step of the DTC. Extra capacitors/cells can be used to provide proper coverage over process, voltage and temperature variations (PVT).

A switched capacitor decoder can be configured to receive the switched capacitor input signal and generate one or more capacitor control signals to activate/connect individual capacitors of the array to the output of the array.

The switched capacitor array can permit implementation in 14 nano-meters (nm) devices, where no length tweaking is possible. The array also reduces the number of thermometric bits needed, which reduces power consumption and errors, such as dynamic errors.

The improved linearity of the switched capacitor array does not require correction due to non linearity. Thus, less information or bits are needed for the lookup table because of the reduced linearity. Thus, the size of the lookup table is substantially smaller than other systems that provide a similar resolution. For example, a size of a lookup table for corrections can be ¹⁄₁₆ of the size of a similar DTC that uses binary inverters to obtain the same resolution.

It is appreciated that the method 600 can be repeated at regular or irregular intervals.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of circuits that may be used to implement disclosed methods and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the disclosed subject matter.

Examples may include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a digital to time converter (DTC). The DTC includes a lookup table, a divider coarse delay component, a thermometric array and a switched capacitor array. The lookup table is configured to generate one or more corrections based on a thermometric bits of an input signal. The divider coarse delay component is configured to generate a plurality of divider signals from an oscillator signal based on the one or more corrections. The thermometric array is configured to generate a medium approximation signal from the plurality of divider signals based on the one or more corrections. The switched capacitor array is configured to generate a digital delay signal from the medium approximation signal based on the one or more corrections and switched capacitor bits.

Example 2 includes the subject matter of claim 1, including or omitting optional elements, where the lookup table includes a first table configured to generate a thermometric correction based on the thermometric bits and wherein the divider and the thermometric array utilize the thermometric correction.

Example 3 includes the subject matter of any of Examples 1-2, including or omitting optional elements, where the lookup table further includes a second table configured to generate an inverse binary delay correction based on the thermometric bits and the switched capacitor array is configured to utilize the binary delay correction.

Example 4 includes the subject matter of any of Examples 1-3, including or omitting optional elements, where the lookup table further includes a third table configured to generate a residue correction based on the thermometric bits and the switched capacitor array is further configured to utilize the residue correction to generate the digital delay signal.

Example 5 includes the subject matter of any of Examples 1-4, including or omitting optional elements, where the coarse delay component is a multi-modulus divider (MMD).

Example 6 includes the subject matter of any of Examples 1-5, including or omitting optional elements, where the middle bits exclude a most significant bit and a least significant bit and the switched capacitor bits are least significant bits of the input signal.

Example 7 includes the subject matter of any of Examples 1-6, including or omitting optional elements, where the switched capacitor array includes a plurality of capacitors connected to an output of the array, wherein the plurality of capacitors are relatively small.

Example 8 includes the subject matter of any of Examples 1-7, including or omitting optional elements, where the switch capacitor array includes a plurality of switches each configured to selectively activate an associated capacitor of the array.

Example 9 includes the subject matter of any of Examples 1-8, including or omitting optional elements, further comprising a switched capacitor decoder configured to receive a fine delay signal and generate a plurality of capacitor control signals coupled to the plurality of switches.

Example 10 includes the subject matter of any of Examples 1-9, including or omitting optional elements, where the switched capacitor array has substantially linear capacitor steps.

Example 11 includes the subject matter of any of Examples 1-10, including or omitting optional elements, where the thermometric array includes a plurality of thermometric inverters.

Example 12 is directed to digital to time converter (DTC) arrangement. The arrangement includes a lookup table, a summation component and a switched capacitor array. The lookup table includes a table configured to generate a residue correction based on thermometric bits of an input signal. The summation component is configured to combine the residue correction with a first signal based on the input signal to generate a fine delay signal. The switched capacitor array is configured to generate a digital delay based on a medium approximation signal and the fine delay signal.

Example 13 includes the subject matter of Example 12, including or omitting optional elements, further comprising a decoder configured to decode the fine delay signal into a plurality of control signals for the switched capacitor array.

Example 14 includes the subject matter of any of Examples 12-13, including or omitting optional elements, where each capacitor of the switched capacitor array has an associated switch configured to receive one of the plurality of control signals from the decoder.

Example 15 includes the subject matter of any of Examples 12-14, including or omitting optional elements, where the digital delay has a substantially finer quantization than the medium approximation signal.

Example 16 includes the subject matter of any of Examples 12-15, including or omitting optional elements, further comprising a combiner configured to generate the first signal based on the input signal and an inverse binary delay correction.

Example 17 includes the subject matter of any of Examples 12-16, including or omitting optional elements, where the lookup table includes a second table configured to generate the inverse binary delay correction based on the thermometric bits, wherein the thermometric bits are middle bits of the input signal.

Example 18 is directed to a method of operating a digital time controller (DTC). The method includes receiving an input signal having a digital delay code, generating one or more corrections using a lookup table based on thermometric bits of the input signal, dividing an oscillator signal based on a thermometric correction of the one or more corrections to generate a plurality of divider signals, generating a medium approximation signal from the plurality of divider signals based on the thermometric correction and generating a digital delay from the medium approximation signal based on a residue correction of the one or more corrections using an array of switched capacitors. The thermometric bits are middle bits of the input signal and exclude a most significant bit and a least significant bit of the input signal.

Example 19 includes the subject matter of Examples 18, including or omitting optional elements, where a multi modulus divider (MMD) is used to generate the plurality of divider signals.

Example 20 includes the subject matter of any of Examples 18-19, including or omitting optional elements, where generating the digital delay is further based on an inverse binary delay correction.

Example 21 is directed towards a digital to time converter (DTC). The converter includes a means for receiving an input signal that indicates a selected delay, wherein the input signal includes a plurality of bits; a means for generating one or more corrections using a lookup table based on thermometric bits of the input signal, wherein the thermometric bits are middle bits of the input signal and exclude a most significant bit and a least significant bit of the input signal; a means for dividing an oscillator signal based on a thermometric correction of the one or more corrections to generate a plurality of divider signals; a means for generating a medium approximation signal from the plurality of divider signals based on the thermometric correction; and a means for generating a delay from the medium approximation signal based on a residue correction of the one or more corrections using an array of switched capacitors.

Although the invention has been illustrated and described with respect to one or more implementations, alterations and/or modifications may be made to the illustrated examples without departing from the spirit and scope of the appended claims. For example, although a transmission circuit/system described herein may have been illustrated as a transmitter circuit, one of ordinary skill in the art will appreciate that the invention provided herein may be applied to transceiver circuits as well.

Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. The component or structure includes a processer executing instructions in order to perform at least portions of the various functions. In addition, while a particular feature of the invention may have been disclosed with respect to only one of several implementations, such feature may be combined with one or more other features of the other implementations as may be desired and advantageous for any given or particular application.

Furthermore, to the extent that the terms "including", "includes", "having", "has", "with", or variants thereof are used in either the detailed description and the claims, such terms are intended to be inclusive in a manner similar to the term "comprising".

What is claimed is:

1. A digital to time converter (DTC) comprising:
   a divider coarse delay component configured to generate a plurality of divider signals from an oscillator signal based on a divider input signal;
   a thermometric array configured to generate a medium approximation signal from the plurality of divider signals;
   a switched capacitor array configured to generate a delay signal from the medium approximation signal; and
   a first circuit configured to combine a first correction with higher order bits of a converter input signal to generate the divider input signal, wherein the converter input signal includes lower order bits, middle bits, and higher order bits and the first correction is based on the middle bits of the input signal.

2. The converter of claim 1, further comprising a lookup table configured to generate the first correction, wherein the lookup table includes a first table configured to generate the first correction based on the middle bits of the converter input signal.

3. The converter of claim 2, wherein the lookup table further includes a second table configured to generate an inverse binary delay correction based on the middle bits of the converter input signal and the switched capacitor array is configured to utilize the inverse binary delay correction.

4. The converter of claim 3, wherein the lookup table further includes a third table configured to generate a residue correction based on the middle bits of the converter input signal and the switched capacitor array is further configured to utilize the residue correction to generate the delay signal.

5. The converter of claim 1, wherein the coarse delay component is a multi-modulus divider (MMD).

6. The converter of claim 1, wherein the middle bits exclude a most significant bit and a least significant bit of the converter input signal.

7. The converter of claim 1, wherein the switched capacitor array includes a plurality of capacitors connected to an output of the array, wherein the plurality of capacitors are relatively small.

8. The converter of claim 7, wherein the switch capacitor array includes a plurality of switches each configured to selectively activate an associated capacitor of the array.

9. The converter of claim 8, further comprising a switched capacitor decoder configured to receive a fine delay signal and generate a plurality of capacitor control signals coupled to the plurality of switches.

10. The converter of claim 1, wherein the switched capacitor array has substantially linear capacitor steps.

11. The converter of claim 1, wherein the thermometric array includes a plurality of thermometric inverters.

12. A digital to time converter (DTC) arrangement comprising:
    a first circuit configured to combine a residue correction with a first signal to generate a fine delay signal;
    a switched capacitor array configured to generate a delay based on a medium approximation signal and the fine delay signal;
    wherein the first signal is based on lower order bits of a converter input signal and the residue correction is based on middle bits of the input signal; and
    a second circuit configured to generate the first signal based on the lower bits of the converter input signal and an inverse binary delay correction, wherein the residue correction is based on middle bits of the converter input signal and the inverse binary delay correction is based on middle bits of the converter input signal.

13. The arrangement of claim 12, further comprising a decoder configured to decode the fine delay signal into a plurality of control signals for the switched capacitor array.

14. The arrangement of claim 13, wherein each capacitor of the switched capacitor array has an associated switch configured to receive one of the plurality of control signals from the decoder.

15. The arrangement of claim 12, wherein the delay comprises a digital delay that has a substantially finer quantization than the medium approximation signal.

16. The arrangement of claim 12, further comprising a lookup table comprising:
    a first table configured to generate the residue correction based on middle bits of the converter input signal, and
    a second table configured to generate the inverse binary delay correction based on the middle bits of the converter input signal.

17. A method of operating a digital time controller (DTC), the method comprising:
    generating a thermometric correction based on thermometric bits of a converter input signal;
    generating a divider input signal based on the thermometric correction and higher order bits of the converter input signal;
    dividing an oscillator signal by a divider based on the divider input signal to generate a plurality of divider signals;
    generating a medium approximation signal from the plurality of divider signals based on the thermometric correction; and
    generating a delay from the medium approximation signal based on a residue correction using an array of switched capacitors.

18. The method of claim 17, wherein the divider is a multi modulus divider (MMD) and is used to generate the plurality of divider signals.

19. The method of claim 17, wherein generating the delay is further based on an inverse binary delay correction, wherein the inverse binary delay correction is provided from a look up table based on the thermometric bits.

20. The DTC arrangement of claim 12, further comprising a thermometric array configured to generate the medium approximation signal from a coarse approximation and a thermometric correction.

21. The DTC arrangement of claim 20, further comprising a divider configured to generate the coarse approximation based on an oscillator signal.

* * * * *